United States Patent
Hideaki et al.

Patent Number: 5,900,279
Date of Patent: May 4, 1999

[54] PROCESSES FOR THE CHEMICAL VAPOR DEPOSITION AND SOLVENT USED FOR THE PROCESSES

[75] Inventors: Machida Hideaki; Nakagawa Masakazu; Megumi Kurihara; Hiroshi Kokubun; Masamichi Shigyo; Sudoh Hiroshi, all of Yamanashi, Japan

[73] Assignee: Tri Chemical Laboratory Inc., Japan

[21] Appl. No.: 08/845,079

[22] Filed: Apr. 18, 1997

Related U.S. Application Data

[63] Continuation of application No. 08/560,743, Nov. 20, 1995, abandoned.

[51] Int. Cl.$^6$ .................................................. C23C 16/18
[52] U.S. Cl. .................. 427/248.1; 427/252; 427/255.1; 427/255.3; 427/229
[58] Field of Search .............................. 427/248.1, 252, 427/255.1, 255.3, 229

[56] References Cited

FOREIGN PATENT DOCUMENTS 1073524  8/1964  United Kingdom .

OTHER PUBLICATIONS

Peterson et al., J. Electrochem. Soc., vol. 142, No. 3, pp. 939–943, Mar. 1995.

*Primary Examiner*—Shrive Beck
*Assistant Examiner*—Timothy Meeks
*Attorney, Agent, or Firm*—Ostrolenk, Faber, Gerb & Soffen, LLP

[57] ABSTRACT

The present invention offers processes for CVD (chemical vapor deposition) that enables one to use a new metallic organic compound as a raw material resource. The present invention involves the steps of: adding a metallic organic compound having a group capable of becoming free to a liquid of a compound having the same group as the group capable of becoming free of the metallic organic compound to prepare a solution; vaporizing the solution; decomposing the metallic organic compound; and depositing a metallic film on a substrate.

28 Claims, 3 Drawing Sheets

PROCESSES FOR THE CHEMICAL VAPOR DEPOSITION AND SOLVENT USED FOR THE PROCESSES

This is a continuation of application Ser. No. 08/560,743, filed Nov. 20, 1995, now abandoned.

BACKGROUND OF THE INVENTION

The present invention relates to processes for Chemical Vapor Deposition (referred to as CVD, hereinafter).

CVD is a method enabling one to mass produce a metallic film of high quality, so it is practically used widely. A raw material used for the conventional CVD, however, is a gas at room temperature, such as silane, arsine, phosphine, diborane, ammonia, hydrogen sulfate, hydrogen selenide. Even in case of using a liquid, it is limited to a raw material which is very easy to vaporize, such as tetraethoxysilane (TEOS) or trimethyl gallium (TMG).

Recently, by the way, CVD is highly appreciated due to its high performance, so the method is used in a variety of technical fields. Especially, the development of usage of the method in the semiconductor industry is remarkable. In this industry, research is going on to use the following compounds that have never been considered to be used as a raw material for CVD: transition-metal compounds, alkali earth metal compounds or unstable metallic hydrogen compounds and compounds mixed with a metallic compound.

However, there are some problems to practically use these new raw materials.

The first problem is that such raw materials are unstable, have low can-stability, are extremely easy to decompose at vaporizing temperature and an addition product thereof is easy to remove.

The second problem is that most of the new raw materials that have not been practically used are solid at vaporizing temperature, so it is difficult to obtain a constant vaporizing amount because of effects of its grain shape and residues of the raw material in a reaction vessel.

The third problem is that each component of the reaction equipment cannot withstand the vaporizing temperature because the temperature is too high.

Here, it can be considered to solve the first problem by adding other substances to these new raw materials for stability.

For CVD, however, it has been never considered to add other substances whose boiling temperatures are different from the raw material, because it is necessary in the conduct of the CVD method to heat the vessel for raw materials, reduce gas pressure or bubble the carrier gas. Especially in the field of semiconductor production, ultra-high purity is needed, so the raw material is limited to a single substance or diluent gas with hydrogen and so on.

In recent some years, a flash vaporing method as a method to solve the above-mentioned second and third problems has been being proposed and studied. The flash vaporing method comprises steps of solving a solid raw material compound in an organic solvent to prepare a solution and continuously and simultaneously vaporing the solved solid compound and the organic solvent in the solution by sending the solution little by little to a heated vaporizer.

However, the organic solvent used for the flash vaporing method is not considered in relation to the raw materials, so the method can not solve the instability of the raw material compounds if the raw material compounds are unstable at the aimed vaporizing temperature. Also it has additional problems such as an effect to produce film by an organic solvent as an additional component and the necessity of addition of evacuation facilities.

SUMMARY OF THE INVENTION

It is an object of the present invention to provide processes for CVD enabling use of a new metallic organic compound as raw material resource.

It is another object of the present invention to provide processes for CVD giving good workability as vapor deposition of a metal film, easy handling of a metallic organic compound as a raw material resource, easiness of usage and enabling one to reduce production cost.

The object of the present invention is achieved by processes for chemical vapor deposition comprising steps of: adding a metallic organic compound having a group capable of becoming free to a liquid compound having the same group as the group capable of becoming free of the metallic organic compound to prepare a solution; decomposing the metallic organic compound by vaporing the solution; and depositing a metallic film on a substrate.

Furthermore, the object of the present invention is achieved by a solvent used for chemical vapor deposition of a metallic organic compound, wherein the solvent includes a compound having a same group as a group capable of becoming free in the metallic organic compound.

In the processes for chemical vapor deposition, it is preferable to vaporize the metallic organic compound having a group capable of becoming free and the compound having a same group as the group capable of becoming free of the metallic organic compound as they are in solution. Especially, it is preferable to simultaneously transport the metallic organic compound having a group capable of becoming free and the compound having a same group as the group capable of becoming free of the metallic organic compound to a vaporizing position and vaporizing them. These steps can restrain decomposition of the metallic organic compound, if it is easy to decompose. Also these steps are useful for efficiency of processes for CVD and make handling of the processes for CVD easy.

For example, the metallic organic compound used for processes for chemical vapor deposition is a compound represented by $M_n R^1 \ldots R^m$ (where, M is a metal, $R^1, \ldots R^m$ are groups selected from a group of groups such as organic groups, hydrogen and a group of silicone compound, n is an integer of from 1 to 4, and m is an integer of from 1 to 8), and the liquid compound to which the metallic organic compound is added is a compound selected from a group of compounds represented by $R^k$ or $R^k.H$ (where, k is an integer of from 1 to 8). Also, the liquid compound enables one to bond with a metal M of said metallic organic compound in a bond form selected from a group of C—M bond, N—M bond, O—M bond, S—M bond, P—M bond and Si—M bond. Especially, it is preferable to use a liquid of a compound enabling one to indirectly bond (indirect bond such as addition bond or coordinate bond) with the metal in the metallic organic compound.

As such a liquid, a DPMH solution can be listed when the metallic organic compound is $DPM_2Cu$ (DPM represents dipivaloylmethane group), a Trien solution can be listed when the metallic organic compound is $DPM_2Cu.Trien_2$ (Trien represents triethlenetetramine), an AcacH solution can be listed when the metallic organic compound is $Acac_2Cu$.(Acac represents acetylacetone group), a triethyl phosphine solution can be listed when the metallic organic compound is Cu cyclopentadienyl.triethyl phosphine, a 2-butyne solution can be listed when the metallic organic compound is HfaCu.2-butyne (Hfa represents hexafluoroacetylacetone group), a TMVS solution can be listed when the metallic organic compound is HfaCu.TMVS (TMVS represents trimethyl vinylsilane), a BTMSA solution can be listed when the metallic organic compound is HfaCu.BTMSA (BTMSA represents bis-trimethyl silylacetylene), a 1,5-cyclooctadiene solution can be listed when the metallic organic compound is HfaCu.1,5-cyclooctadiene, a hexafluoroacetylacetone solution can be listed when the metallic organic compound is $Hfa_2Cu$, a triethylamine solution can be listed when the metallic organic compound is $AlH_3.NEt_3$ (where, $Et=C_2H_5$), a diethylmethylamine solution can be listed when the metallic organic compound is $AlH_3.NEt_2Me$ (where, $Et=C_2H_5$, $Me=CH_3$), a dimethylethylamine solution can be listed when the metallic organic compound is $AlH_3.NMe_2Et$, a triethylamine solution can be listed when the metallic organic compound is $Me_3Al.NEt_3$, a dimethylethylamine solution can be listed when the metallic organic compound is $Me_3Ga.NMe_2Et$, a dimethylethylamine solution can be listed when the metallic organic compound is $Me_3In.NMe_2Et$, a di-isopropylamine solution can be listed when the metallic organic compound is $Me_3In.HN(i-C_3H_7)_2$, a Trien solution can be listed when the metallic organic compound is $DPM_2Sr.Trien_2$, a tetraglyme solution can be listed when the metallic organic compound is $DPM_2Sr.tetraglyme_2$ (where, tetraglyme=tetraethylene glycol dimethylether), a triglyme solution can be listed when the metallic organic compound is $Hfa_2Sr.triglyme_2$ (triglyme represents triethylene glycol dimethylether), a triglyme solution can be listed when the metallic organic compound is $DPM_2Sr.triglyme_2$, a triglyme solution can be listed when the metallic organic compound is $DPM_2Ba.triglyme_2$, a tetraethylenepentamine solution can be listed when the metallic organic compound is $DPM_2Ba.$(tetraethylenepentamine)$_2$, a DPMH solution can be listed when the metallic organic compound is $DPM_2TiO$, a diethylamine solution can be listed when the metallic organic compound is $Ti(NEt_2)_4$, a Trien solution can be listed when the metallic organic compound is $DPM_2Pb.Trien_2$, a DPMH solution can be listed when the metallic organic compound is $DPM_2Pb$, an isopropylalcohol solution can be listed when the metallic organic compound is $PbEt_3(i-OPr)$, an isopropylalcohol solution can be listed when the metallic organic compound is $Ti(i-OPr)_4$, a benzene solution can be listed when the metallic organic compound is triphenyl bismuth, a toluene solution can be listed when the metallic organic compound is tris-o-toluylic bismuth or tris-m-toluylic bismuth, a triethylamine solution can be listed when the metallic organic compound is $Me_2Zn.NEt_3$, an $HN(CH_3)CH_2CH_2N(CH_3)_2$ solution can be listed when the metallic organic compound is $MeZnN(CH_3)CH_2CH_2N(CH_3)_2$, an HfaH solution can be listed when the metallic organic compound is $Me_2AuHfa$, an AcacH solution can be listed when the metallic organic compound is $Me_2Au(Acac)$, an HfaH solution can be listed when the metallic organic compound is $Hfa_2Pt$, an AcacH solution can be listed when the metallic organic compound is $Acac_2Co$, a benzene solution can be listed when the metallic organic compound is bis-benzene chromium, an ethanol solution can be listed when the metallic organic compound is $(EtO)_5Ta$, and an $Me_4Si$ solution can be listed when the metallic organic compound is $Ti(CH_2SiMe_3)_4$.

When adding a metallic organic compound to a solvent according to the above examples, the solubility of the metallic organic compound in the solvent is good because they have a similar group.

In addition, as the equilibrium formulas
$$R^1R^2R^3M+H \leftrightarrow R^1R^2M+R^3H$$
$$R^4R^5M.R^6 \leftrightarrow R^4R^5M+R^6$$
show, the metallic organic compound added in the solvent according to the above example is stable because there is a large amount of $R^3H$ or $R^6$ so the equilibrium condition goes to the left side. This means that the can-stability is good.

By the way, from its nature, the processes for CVD can not avoid a non-equilibrium condition caused by the vapor transport problem, that is, an organic compound of low boiling temperature on the right side of the equilibrium formulas is vapor transported immediately and lost. Namely, the reaction goes to right in the equilibrium formulas. The $R^1R^2M$ or $R^4R^5M$ from which the organic compound $R^3H$ or $R^6$ have been removed has lost vaporization property. The $R^1R^2M$ or $R^4R^5M$ opts to be decomposed immediately because it is in abnormal polyvalent condition or unstable due to lack of the stabilization factor $R^3H$ or $R^6$. These phenomena are accelerated by heating the metallic organic compound to vaporize it.

However, it can be possible to realize stable vaporization by adding the $R^3H$ or $R^6$ to be removed in advance to accelerate a reaction in the left direction in the above-mentioned equilibrium formulas.

To deal with existence of two kinds or more compounds of which boiling temperatures are different each other, the present invention comprises steps of: heating a solution or reducing gas pressure, sending the solution little by little to an evaporator in which a carrier gas flows and simultaneously vaporizing the compound and solvent in the solution. These steps enable one to keep a temperature of vessel in which the solution of the metallic organic compound is put lower than that of the evaporator and effectively restrain decomposition.

In addition, the processes for CVD need a step of decomposition of the compound after vapor transportation. In this decomposition step, the compound other than needed for production of a film becomes an exhaust gas. For example, as the following chemical formula shows:
$$R^1R^2R^3M \rightarrow \text{(decomposition)} \rightarrow M\downarrow + R^1H\uparrow + R^2H\uparrow + R^3H\uparrow$$
$R^1H$, $R^2H$ and $R^3H$ are produced in the CVD process. These gases must be processed. Especially, in the flash vaporing method, it has been necessary to additionally install evacuation facilities for exhaust gas to existent evacuation facilities for exhaust gases such as $R^1H$ and so on.

However, the processes for CVD of the present invention do not need any additional evacuation facilities except for those for the product gases, $R^1H$, $R^2H$ and $R^3H$. This is a preferable point of the present invention from the view of running cost.

Like this, the present invention enables one to stably transport and vaporize raw materials (unstable compounds) for the processes for CVD. As a result, the present invention realizes easy handling of a metallic organic compound, easiness of usage and reduction of production cost.

Additionally, it becomes possible to use a new type of metallic organic compound conventionally never used for the processes for CVD as a raw material resource. More, exhaust gas evacuation facilities can be made simple by the present invention.

DESCRIPTION OF THE PREFERRED EMBODIMENTS

Figure 1:
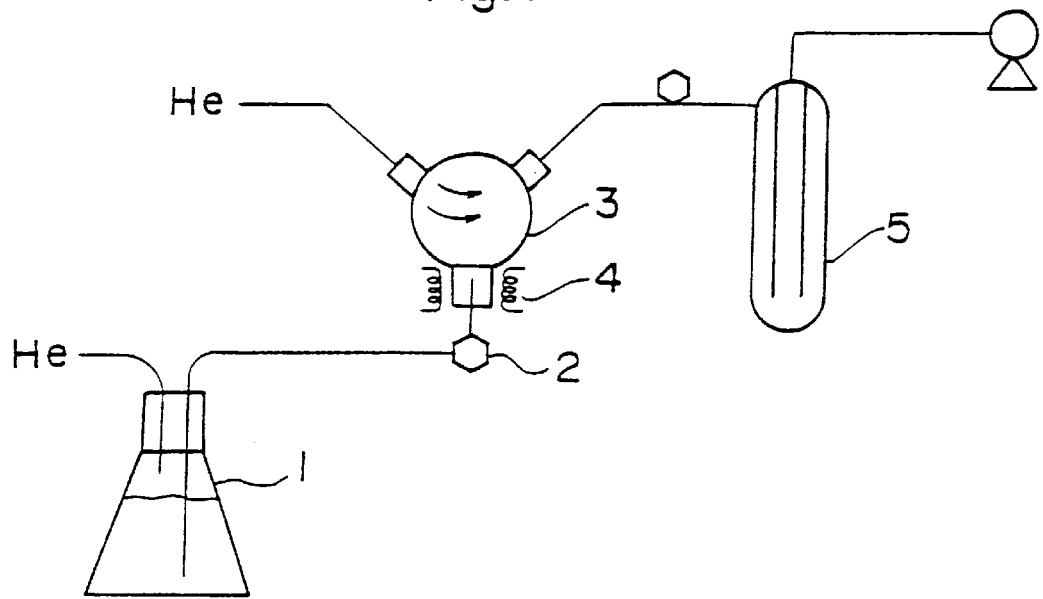
FIG. 1 illustrates an outline of an evaporator.

Next, referring to concrete embodiments, the present invention is explained.

Relations between a metallic organic compound having a group capable of becoming free and a solvent of a compound having a same group as the group capable of becoming free in the metallic organic compound are explained for respective cases.

TABLE 1

| Metallic organic compound | Solvent (Liquid) |
|---|---|
| $DPM_2Cu$ | DPMH |
| $DPM_2Cu.Trien_2$ | Trien |
| $Acac_2Cu$ | AcacH |
| Cu cyclopentadienyl.triethyl phosphine | Triethyl phosphine |
| HfaCu.2-butyne | 2-butyne |
| HfaCu.TMVS | TMVS |
| HfaCu.BTMSA | BTMSA |
| HfaCu.1,5-cyclooctadiene | 1,5-cyclooctadiene |
| $Hfa_2Cu$ | HfaH |
| $AlH_3.NEt_3$ | triethylamine |
| $AlH_3.NEt_2Me$ | diethylmethylamine |
| $AlH_3.NMe_2Et$ | dimethylethylamine |
| $ME_3Al.NEt_3$ | triethylamine |
| $Me_3Ga.NMe_2Et$ | dimethylethylamine |
| $Me_3In.NMe_2Et$ | dimethylethylamine |
| $Me_3In.HN(i-C_3H_7)_2$ | di-isopropylamine |
| $DPM_2Sr.Trien_2$ | Trien |
| $DPM_2Sr.tetraglyme_2$ | tetraglyme |
| $DPM_2Sr.triglyme_2$ | triglyme |
| $Hfa_2Sr.triglyme_2$ | triglyme |
| $DPM_2Ba.triglyme_2$ | triglyme |
| $DPM_2Ba.tetraethylenepentamine_2$ | tetraethylenepentamine |
| $DPM_2TiO$ | DPMH |
| $DPM_2Pb.Trien_2$ | Trien |
| $DPM_2Pb$ | DPMH |
| $PbEt_3(i-OPr)$ | isopropylalcohol |
| $Ti(i-OPr)_4$ | isopropylalcohol |
| $Ti(NEt_2)_4$ | diethylamine |
| triphenyl bismuth | benzene |
| tris-o-toluylic bismuth | toluene |
| tris-m-toluylic bismuth | toluene |
| $Me_2Zn.NEt_3$ | triethylamine |
| $MeZnN(CH_3)CH_2CH_2N(CH_3)_2$ | $HN(CH_3)CH_2CH_2N(CH_3)_2$ |
| $Me_2AuHfa$ | HfaH |
| $Me_2Au(Acac)$ | AcacH |
| $Hfa_2Pt$ | HfaH |
| $Acac_2Co$ | AcacH |
| bis-benzene chromium | benzene |
| $(EtO)_5Ta$ | ethanol |
| $Ti(CH_2SiMe_3)_4$ | $Me_4Si$ |
| $(Et_2N)_4Ti$ | diethylamine |

These metallic organic compounds were soluble to corresponding solvents shown in Table-1. Namely, it can be found that if adding a metallic organic compound having a group capable of becoming free to a liquid of a compound having a same group as the group capable of becoming free in the metallic organic compound, they are uniformly mixed.

Next, after storing these solutions at 20° C., alteration was observed. The degree of alteration was small. That is, the metallic organic compounds added to corresponding solvents (liquids) are remarkably stable.

Contrary to this, in case of storing HfaCu.TMVS at 20° C., decomposition gradually started and the color of HfaCu.TMVS changed from yellow to green. In case of storing $AlH_3.NMe_2Et$ at 20° C., decomposition occurred and big amount of white gray sediment was produced. When there is no relation described above between a metallic organic compound and a solvent, even if adding the metallic organic compound to the solvent, the metallic organic compound is not stable. For example, prepared were a solution made by adding $DPM_2Sr.triglyme_2$ to tetrahydrofuran (THF) generally used for a flash vaporing method and a solution made by adding $DPM_2Sr.triglyme_2$ to triglyme, and the vaporization properties of the two cases were examined after one month storing and distilling the solvents. As a result, the triglyme solution had more than 95% of vaporization property, but that of the THF solution was under 90%. Namely, a solution using a solvent meeting the above-mentioned relation is stable and can realize long time can-stability.

In the embodiment of the present invention, the evaporator shown in FIG. 1 was used. In FIG. 1, the numeral 1 shows a vessel. $AlH_3.NMe_2Et$ and dimethylethylamine are mixed in equivalence to each other, for example. The mixture solution is press transported by He gas to an evaporator 3 through being controlled by a micro-liquid controller 2. Before this step, the mixture is heated by a heater 4 so that the mixture transported to the mixture evaporator 3 is immediately vaporized because the pressure of mixture is reduced and a carrier gas exists. Then the gas is collected by a cold trap 5. The recovery was more than 90%. Any decomposition of $AlH_3.NMe_2Et$ was not found in the part from the vessel 1 to the evaporator 3.

Figure 2:
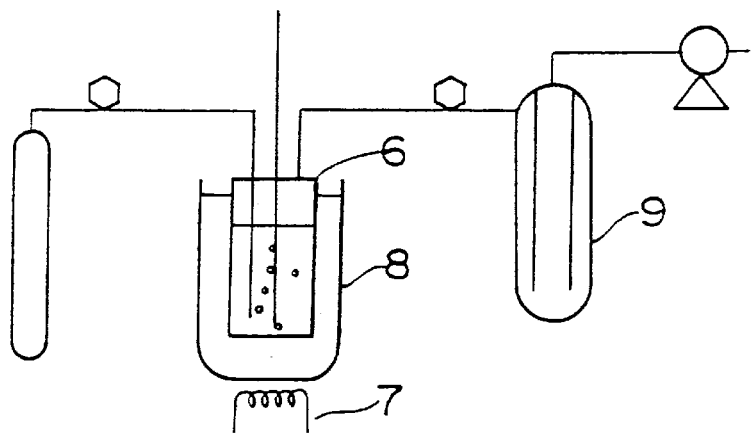
FIG. 2 illustrates an outline of an evaporator.

Contrary to this, recovery was examined using a conventional evaporator (numeral 6 is a vessel, 7 is a heater, 8 is a oil bath and 9 is a cold trap) shown in FIG. 2, where $AlH_3.NMe_2Et$ was put into the vessel 6, flown by hydrogen gas (carrier gas), bubbled and heated in the oil bath 8 to 60° C., vaporized and collected by the cold trap 9. The resulted recovery was only 70% to 80%, and aluminum powder sticked onto the inner surface of the vessel 6. That is, a certain amount of decomposition of $AlH_3.NMe_2Et$ was found.

Putting equivalent amounts of HfaCu.TMVS and trimethylvinylsilane into the vessel 1 in FIG. 1, a similar process to the above was conducted. The recovery was 95% to 100%, and decomposition product of HfaCu.TMVS was not found in the part from the vessel 1 to the evaporator 3.

Contrary to this, decomposition of HfaCu.TMVS was found many places when trying vapor transportation with HfaCu.TMVS in the vessel 6 of FIG. 2.

In case of mixing $DPM_2Pb$ and DPMH (mixture ratio is 1:1 to 1:50) and vaporizing them at 100° C. to 250° C., decomposition of $DPM_2Pb$ could not be found in the part from the vessel 1 to the evaporator 3.

Contrary to this, decomposition of $DPM_2Pb$ was found when trying vapor transportation with $DPM_2Pb$ in the vessel 6 of FIG. 2.

Figure 3:
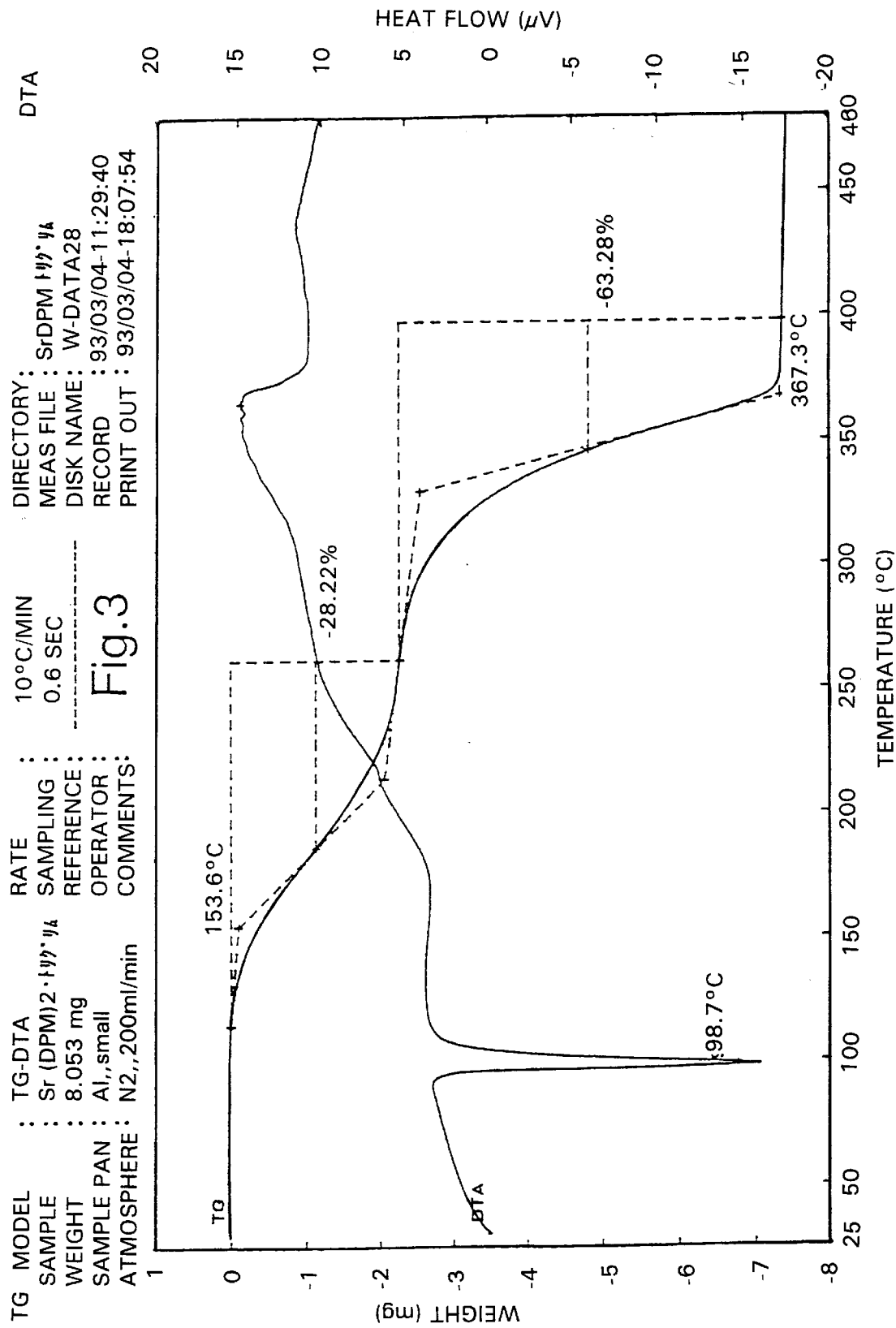
FIG. 3 is a chart of heat analysis of $DPM_2Sr.Triglyme_2$.

FIG. 3 shows a result of a heat analysis of $DPM_2Sr.triglyme_2$. The added triglyme was removed in a temperature range of from 100° C. to 250° C. From these results, it is difficult to conduct vaporization with the prior art shown in FIG. 2. However, in case of adopting the method of the present invention, that is, solving $DPM_2Sr.triglyme_2$ into triglyme, adding a suitable amount of general organic solvent to reduce viscosity and using the evaporator shown in FIG. 1, vapor transportation could be conducted in a good condition at the temperature range of from 150° C. to 350° C.

Triethylisopropoxy lead is decomposed by light, the isopropoxide group of the compound removed in air and decomposed at temperature of 100° C. or more, so that vapor transportation thereof by prior art has been very difficult. However, vapor transportation thereof at the temperature of from 30° C. to 80° C. was very easy when solving triethylisopropoxy Pb into isopropylalcohol (mixture ratio is in the range of from 1:0.25 to 1:3) and using the equipment shown in FIG. 1.

Moreover, the melting point of tris-m-toluylic bismuth is in the range of from 48° C. to 49° C. and the boiling point thereof is 90° C. at 0.1 to 1 mmHg. Therefore, it is decomposed by a long heating time for vaporization. However, in case of solving tris-m-toluylic bismuth into toluene and using the equipment in FIG. 1 to vaporize, easy vapor transportation could be realized in a range of from 50° C. to 120° C. The recovery of this condition was in the range of from 90% to 100%.

Figure 4:
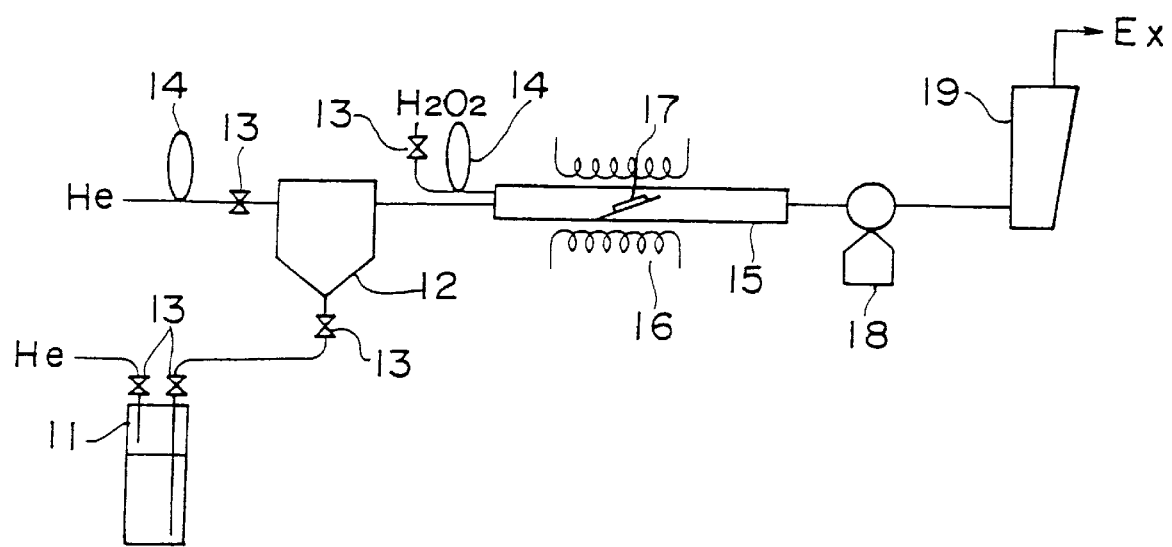
FIG. 4 illustrates an outline of a CVD equipment.

FIG. 4 illustrates an outline of CVD equipment of the present invention.

In this figure, numeral 11 is a vessel, 12 is an evaporator, 13 is a stop valve, 14 is a flow controller, 15 is a reaction pipe, 16 is a heater, 17 is a substrate, 18 is a vacuum pump and 19 is an exhaust gas evacuation facility.

In this equipment, 50%—50% mixture of $AlH_3.NMe_2Et$ and dimethylethylamine is put into the vessel 11, then guided to the evaporator 12 by pressure of He gas and vaporized. Next, it is guided to the reaction pipe 15 and deposited on the substrate 17. A film produced by the CVD was examined. It was Al.

Moreover, a mixture of HfaCu.TMVS and trimethylvinylsilane put into the vessel 11 was examined in the same manner as the above. As a result, a Cu film was deposited on the substrate 17 that was heated to from 190° C. to 230° C.

Furthermore, a mixture of $(Et_2N)_4Ti$ and diethylamine put into the vessel 11 was examined in the same manner as the above. As a result, a Ti film was deposited on the substrate 17.

Furthermore, a mixture of $Hfa_2Cu$ and HfaH put into the vessel 11 was examined in the same manner as the above. As a result, a Cu film was deposited on the substrate 17.

Additionally, each mixture of a metallic organic compound and a solvent in the relation described in the above Table-1 was examined in the same manner as the above. As a result, a film was deposited on the substrate.

What is claimed is:

1. A process for chemical vapor deposition comprising the sequential steps of:

forming a solution by adding a metallic organic compound having a group which is dissociable from the metallic organic compound upon decomposition of the metallic organic compound and which bonds with a metal (M) in said metallic organic compound in a bond form selected from the group consisting of C—M bond, N—M bond, O—M bond, S—M bond and P—M bond to a liquid compound which consists essentially of a same group as said dissociable group of said metallic organic compound;

decomposing said metallic organic compound; and depositing a film containing said metal from said metallic organic compound on a substrate.

2. The process for chemical vapor deposition of claim 1, wherein said metallic organic compound and said liquid compound are vaporized.

3. The process for chemical vapor deposition of claim 1, wherein said liquid compound is DPMH and said metallic organic compound is a compound selected from the group consisting of $DPM_2Cu$, $DPM_2TiO$ and $DPM_2Pb$.

4. The process for chemical vapor deposition of claim 1, wherein said liquid compound is trien and said metallic organic compound is a compound selected from the group consisting of $DPM_2Cu.trien_2$, $DPM_2Sr.trien_2$ and $DPM_2Pb.trien_2$.

5. The process for chemical vapor deposition of claim 1, wherein said liquid compound is AcacH and said metallic organic compound is a compound selected from the group consisting of $Acac_2Cu$, $Me_2Au(Acac)$ and $Acac_2Co$.

6. The process for chemical vapor deposition of claim 1, wherein said liquid compound is Triethyl phosphine and said metallic organic compound is Cu cyclopentadienyl.triethyl phosphine.

7. The process for chemical vapor deposition of claim 1, wherein said liquid compound is 2-butyne and said metallic organic compound is HfaCu.2-butyne.

8. The process for chemical vapor deposition of claim 1, wherein said liquid compound is BTMSA and said metallic organic compound is HfaCu.BTMSA.

9. The process for chemical vapor deposition of claim 1, wherein said liquid compound is 1,5-cyclooctadiene and said metallic organic compound is HfaCu.1,5-cyclooctadiene.

10. The process for chemical vapor deposition of claim 1, wherein said liquid compound is HfaH and said metallic organic compound is a compound selected from the group consisting of $Hfa_2Cu$, $Me_2AuHfa$ and $Hfa_2Pt$.

11. The process for chemical vapor deposition of claim 1, wherein said liquid compound is triethylamine and said metallic organic compound is a compound selected from the group consisting of $AlH_3.NEt_3$, $Me_3Al.NEt_3$ and $Me_2Zn.NEt_3$.

12. The process for chemical vapor deposition of claim 1, wherein said liquid compound is diethylmethylamine and said metallic organic compound is $AlH_3.NEt_2Me$.

13. The process for chemical vapor deposition of claim 1, wherein said liquid compound is dimethylethylamine and said metallic organic compound is a compound selected from the group consisting of $AlH_3.NMe_2Et$, $Me_3Ga.NMe_2Et$ and $Me_3In.NMe_2Et$.

14. The process for chemical vapor deposition of claim 1, wherein said liquid compound is di-isopropylamine and said metallic organic compound is $Me_3In.HN(i-C_3H_7)_2$.

15. The process for chemical vapor deposition of claim 1, wherein said liquid compound is tetraglyme and said metallic organic compound is $DPM_2Sr.tetraglyme_2$.

16. The process for chemical vapor deposition of claim 1, wherein said liquid compound is triglyme and said metallic organic compound is a compound selected from the group consisting of $DPM_2Sr.triglyme_2$, $Hfa_2Sr.triglyme_2$ and $DPM_2Ba.triglyme_2$.

17. The process for chemical vapor deposition of claim 1, wherein said liquid compound is tetraethylenepentamine and said metallic organic compound is $DPM_2Ba.tetraethylenepentamine_2$.

18. The process for chemical vapor deposition of claim 1, wherein said liquid compound is isopropylalcohol and said metallic organic compound is a compound selected from the group consisting of $PbEt_3(i-OPr)$ and $Ti(i-OPr)_4$.

19. The process for chemical vapor deposition of claim 1, wherein said liquid compound is diethylamine and said metallic organic compound is $Ti(NEt_2)_4$.

20. The process for chemical vapor deposition of claim 1, wherein said liquid compound is benzene and said metallic organic compound is a compound selected from the group consisting of triphenyl bismuth and bis-benzene chromium.

21. The process for chemical vapor deposition of claim 1, wherein said liquid compound is toluene and said metallic organic compound is a compound selected from the group consisting of tris-o-toluylic bismuth and tris-m-toluylic bismuth.

22. The process for chemical vapor deposition of claim 1, wherein said liquid compound is $HN(CH_3)CH_2CH_2N(CH_3)_2$ and said metallic organic compound is $MeZnN(CH_3)CH_2CH_2N(CH_3)_2$.

23. The process for chemical vapor deposition of claim 1, wherein said liquid compound is ethanol and said metallic organic compound is $(EtO)_5Ta$.

24. A process for chemical vapor deposition comprising the sequential steps of:

forming a solution by adding a metallic organic compound having a group which is dissociable from the metallic organic compound upon decomposition of the metallic organic compound and in which a metal (M) of said metallic organic compound is selected from the group consisting of Au, Pt, Al, Zn, Ga, In, Sr, Ba, Pb, Ti, Bi, Cr, Ta and Co to a liquid compound which consists essentially of a group which is the same as said group in said metallic organic compound;

decomposing said metallic organic compound; and depositing a film containing said metal from said metallic organic compound on a substrate.

25. The process for chemical vapor decomposition of claim 24, wherein said metallic organic compound is a compound represented by $M_n R^1 \ldots R^m$ where M is said metal, $R^1 \ldots R^m$ are groups individually selected from the group consisting of organic groups, hydrogen and silicone compounds, n is an integer of from 1 to 4, and m is an integer of from 1 to 8, and said liquid compound to which said metallic organic compound is combined is $R^k$ or $R^k.H$ where k is an integer of from 1 to 8 and R is said dissociable group.

26. The process for chemical vapor deposition of claim 24, wherein said liquid compound bonds with said metal M of said metallic organic compound in a bond form selected from the group consisting of C—M bond, N—M bond, O—M bond, S—M bond, P—M bond and Si—M bond.

27. The process for chemical vapor deposition of claim 24, wherein said liquid compound is $Me_4Si$ and said metallic organic compound is $Ti(CH_2SiMe_3)_4$.

28. The process for chemical vapor deposition of claim 24, wherein said liquid compound is selected from the group consisting of triene, 1,5-cyclooctadiene, HfaH, tetraglyme, triglyme, tetraethylenepentamine and diethylamine.

* * * * *